United States Patent [19]

Yotsuyanagi

[11] Patent Number: 5,477,170
[45] Date of Patent: Dec. 19, 1995

[54] COMPARATOR CAPABLE OF PREVENTING LARGE NOISE VOLTAGE

[75] Inventor: Michio Yotsuyanagi, Tokyo, Japan

[73] Assignee: NEC Corporation, Tokyo, Japan

[21] Appl. No.: 197,885

[22] Filed: Feb. 17, 1994

[51] Int. Cl.⁶ .................................................. H03K 5/22
[52] U.S. Cl. ............................. 327/66; 327/63; 327/53
[58] Field of Search .......................... 327/63, 65, 66–70, 327/77, 80, 81, 82, 88, 89, 51, 53, 427; 330/253, 257; 323/315, 316

[56] References Cited

U.S. PATENT DOCUMENTS

| | | | |
|---|---|---|---|
| 4,047,059 | 9/1977 | Rosenthal | 327/66 |
| 4,529,891 | 7/1985 | Oida | 327/77 |
| 4,618,785 | 10/1986 | van Tran | 307/530 |
| 4,812,681 | 3/1989 | Pumphrey | 327/77 |
| 5,136,184 | 8/1992 | Deevy | 327/77 |
| 5,189,318 | 2/1993 | Tanaka | 330/253 |

FOREIGN PATENT DOCUMENTS

| | | |
|---|---|---|
| 0174736 | 3/1986 | European Pat. Off. . |
| 59-64916 | 4/1984 | Japan . |
| 5102807 | 4/1993 | Japan . |
| 5243867 | 9/1993 | Japan . |

OTHER PUBLICATIONS

Technical Study Report in the Transactions of the Institute of Electronics, Information and Communication Engineers, ICD 89-115, vol. 89, No. 205, Sep. 1989, pp. 25–31. No Translation.

Primary Examiner—Toan Tran
Attorney, Agent, or Firm—Whitham, Curtis, Whitham & McGinn

[57] ABSTRACT

A first field effect transistor has a drain electrode connected to a first current input terminal of a first current mirror circuit and a gate electrode connected to a first voltage input terminal which is supplied with a first voltage input terminal. A second field effect transistor has a drain electrode connected to a first current output terminal of the first current mirror circuit and a gate electrode connected to a second voltage input terminal which is supplied with a second input voltage. A second current mirror circuit has a second current input terminal connected to the first current output terminal and a second current output terminal connected to a power terminal through a resistor and to a voltage output terminal which is supplied with an output voltage. A comparator may include third and fourth current mirror circuits instead of the first and the second field effect transistors. In this event, the third current mirror circuit has a third current input terminal supplied with a first input current and a third current output terminal connected to the first current input terminal. The fourth current mirror circuit has a fourth current input terminal supplied with a second input current and a fourth current output terminal connected to the first current output terminal.

18 Claims, 4 Drawing Sheets

COMPARATOR CAPABLE OF PREVENTING LARGE NOISE VOLTAGE

BACKGROUND OF THE INVENTION

The present invention relates to a comparator for comparing a first input voltage and a second input voltage to produce an output voltage and relates also to a comparator for comparing a first input current and a second input current to produce an output voltage.

A conventional comparator is disclosed in the Technical Study Report in the Transactions of the Institute of Electronics, Information and Communication Engineers, ICD 89–115, Vol. 89, No. 205, September 1989, pages 25 to 31. This conventional comparator comprises an amplifier unit and a latch unit connected to the amplifier unit. The amplifier unit comprises first through fourth amplifiers, four capacitors connected to the amplifiers, and a plurality of switches connected to the amplifiers. The first amplifier has a voltage input terminal and a reference voltage input terminal. The voltage input terminal is supplied with an input voltage. The reference voltage terminal is supplied with a reference input voltage.

This conventional comparator produces a difference voltage of the input voltage and the reference input voltage to amplify the difference voltage. On the other hand, the conventional comparator is incapable of preventing a large noise voltage which is caused by incidental capacitive coupling. Consequently, inasmuch as the large noise voltage is included in the difference voltage, the conventional comparator is incapable of reliably operating.

Another conventional comparator is disclosed in Japanese Patent Prepublication No. 102807/1993 (Tokkai Hei 5-102807). This conventional comparator comprises a first power terminal, a second power terminal, a first resistor and a first current source directly connected between the first and the second power terminals, a second resistor and a second current source directly connected between the first and the second power terminals, and a comparing unit connected to a node between the first resistor and the first current source and to a node between the second resistor and the second current source. The first resistor is supplied with an input current. The second resistor is supplied with a reference input current. The comparing unit is supplied with an input voltage corresponding to the input current and with a reference input voltage corresponding to the reference input current.

This conventional comparator converts the input current and the reference input current into the input voltage and the reference input voltage to compare the input voltage and the reference input voltage. Namely, this conventional comparator does not compare the input current and the reference input current. In addition, the comparing unit is incapable of speedily operating. Consequently, the conventional comparator is incapable of speedily operating.

SUMMARY OF THE INVENTION

It is therefore an object of the present invention to provide a comparator which is capable of preventing a large noise voltage caused by incidental capacitive coupling.

It is another object of this invention to provide a comparator which is capable of speedily operating.

Other objects of this invention will become clear as the description proceeds.

According to an aspect of this invention, there is provided a comparator having first and second voltage input terminals and a voltage output terminal for comparing a first input voltage from the first voltage input terminal and a second input voltage from the second voltage input terminal to produce and supply an output voltage to the voltage output terminal. The comparator comprises (A) a first current mirror circuit having a first current input terminal and a first current output terminal; (B) a first field effect transistor having a first drain electrode connected to the first current input terminal, a first source electrode connected to a first power terminal, and a first gate electrode connected to the first voltage input terminal, the first power terminal supplied with a low voltage having a low level; (C) a second field effect transistor having a second drain electrode connected to the first current output terminal, a second source electrode connected to the first power terminal, and a second gate electrode connected to the second voltage input terminal; and (D) a second current mirror circuit having a second current input terminal connected to the first current output terminal and a second current output terminal connected to a second power terminal through a resistor and to the voltage output terminal, the second power terminal supplied with a high voltage having a high level which is higher than the low level.

According to another aspect of this invention, there is provided a comparator having first and second current input terminals and a voltage output terminal for comparing a first input current from the first current input terminal and a second input current from the second current input terminal to produce and supply an output voltage to the voltage output terminal. The comparator comprises (A) a first current mirror circuit having a first current output terminal and the first current input terminal; (B) a second current mirror circuit having a second current output terminal and the second current input terminal; (C) a third current mirror circuit having a third current input terminal connected to the first current output terminal and a third current output terminal connected to the second current output terminal; and (D) a fourth current mirror circuit having a fourth current input terminal connected to the third current output terminal and to the second current output terminal and a fourth current output terminal connected to a power terminal through a resistor and to the voltage output terminal, the power terminal supplied with a power voltage.

DESCRIPTION OF THE PREFERRED EMBODIMENTS

Figure 1:
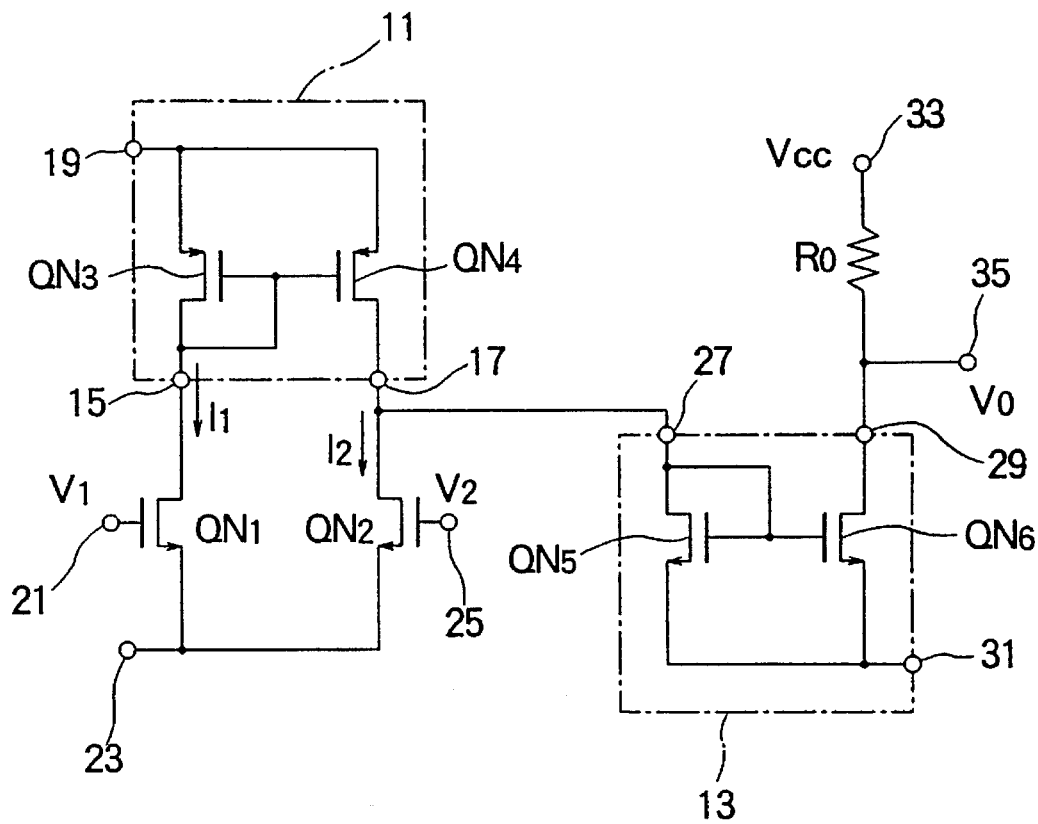
FIG. 1 is a circuit diagram of a comparator according to a first embodiment of this invention.

Referring to FIG. 1, the description will proceed to a comparator according to a first embodiment of this invention.

The comparator comprises a first current mirror circuit 11, a first field effect transistor $QN_1$, a second field effect transistor $QN_2$, and a second current mirror circuit 13.

The first current mirror circuit 11 has a first current input terminal 15, a first current output terminal 17, and a power terminal 19. The first current input terminal 15 is supplied with a first input current $I_1$. The first current output terminal 17 is supplied with a first output current $I_2$. The power terminal 19 is supplied with a first constant power voltage from a power supply unit (not shown).

The first current mirror circuit 11 comprises third and fourth field effect transistors $QN_3$ and $QN_4$. The third field effect transistor $QN_3$ has a drain electrode connected to the first current input terminal 15, a gate electrode connected to the first current input terminal 15, and a source electrode connected to the power terminal 19. The fourth field effect transistor $QN_4$ has a drain electrode connected to the first current output terminal 17, a gate electrode connected to the first current input terminal 15, and a source electrode connected to the first power terminal 19.

The first field effect transistor $QN_1$ has a drain electrode connected to the first current input terminal 15, a gate electrode connected to a first voltage input terminal 21, and a source electrode connected to a power terminal 23. The first voltage input terminal 21 is supplied with a first input voltage $V_1$. The power terminal 23 is supplied with a first power voltage from a power supply unit (not shown). The first power voltage has a first level.

The second field effect transistor $QN_2$ has a drain electrode connected to the first current output terminal 17, a gate electrode connected to a second voltage input terminal 25, and a source electrode connected to the power terminal 23. The second voltage input terminal 25 is supplied with a second input voltage $V_2$.

The second mirror circuit 13 has a second current input terminal 27, a second current output terminal 29, and a second power terminal 31. The second current input terminal 27 is connected to a node between the first current output terminal 17 and the drain electrode of the second field effect transistor $QN_2$.

The second mirror circuit 13 comprises fifth and sixth field effect transistors $QN_5$ and $QN_6$. The fifth field effect transistor $QN_5$ has a drain electrode connected to the second current input terminal 27, a gate electrode connected to the second current input terminal 27, and a source electrode connected to a power terminal 31. The sixth field effect transistor $QN_6$ has a drain electrode connected to the second current output terminal 29, a gate electrode connected to the second current input terminal 27, and a source electrode connected to the power terminal 31. The power terminal 31 is supplied with a second constant power voltage from a power supply unit (not shown).

The second current output terminal 29 is connected to a second power terminal 33 through a resistor $R_0$. The second power terminal 33 is supplied with a second power voltage $V_{cc}$ from a power supply unit (not shown). A voltage output terminal 35 is connected to a node between the resistor $R_0$ and the drain electrode of the sixth field effect transistor $QN_6$. The voltage output terminal 35 is supplied with an output voltage $V_0$. The second power voltage $V_{cc}$ has a second level which is higher than the first level of the first power voltage.

Figure 2:
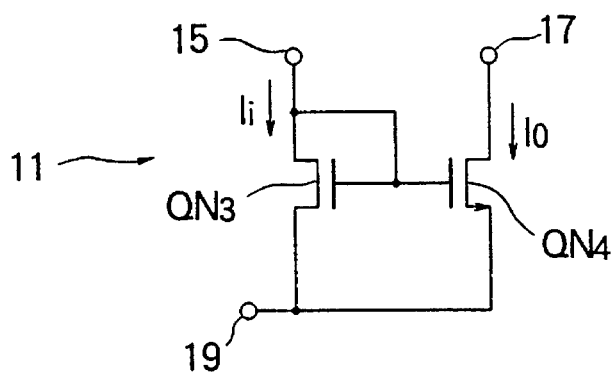
FIG. 2 is a circuit diagram of a part of the comparator illustrated in FIG. 1.

Referring to FIG. 2 together with FIG. 1, the operation of the comparator will be described.

In FIG. 2, it will be assumed that the third field effect transistor $QN_3$ has a channel length $L_i$ and a channel width $W_i$ and the fourth field effect transistor $QN_4$ has a channel length $L_0$ and a channel width $W_0$. The first current mirror circuit 11 outputs a current $I_0$ through the first current output terminal 17 when the first current mirror circuit 11 is supplied with a current $I_i$ through the current input terminal 15 and when the fourth field effect transistor $QN_4$ is in saturation. In this event, $I_0$ is represented by a following formula (1).

$$I_0 = \frac{W_0/L_0}{(W_i/L_i)} \times I_i \qquad (1)$$

It will be assumed that the ratio of $(W_0/L_0)$ to $(W_i/L_i)$ is equal to 1. In this event, Formula (1) is rewritten into a following formula (2).

$$I_0 = I_i \qquad (2)$$

Consequently, in FIG. 1, it will be assumed that the ratio of $(W_0/L_0)$ to $(W_i/L_i)$ is equal to 1. In this event, $I_1$ is represented by a following formula (3).

$$I_1 = K_1(V_1 - V_2)^2/2 \qquad (3)$$

In Formula (3), $K_1$ represents an element constant of the first field effect transistor $QN_1$ and $V_t$ represents a threshold voltage in each of the first and the second field effect transistors $QN_1$ and $QN_2$. $I_2$ is represented by a following formula (4).

$$I_2 = K_2(V_2 - V_2)^2/2 \qquad (4)$$

In Formula (4), $K_2$ represents an element constant of the second field effect transistor $QN_2$. In Formula (4), it will be assumed that $V_2$ is not greater than $2 \times V_t$.

When $I_1$ is greater than $I_2$, the first current output terminal 17 is supplied with the current $I_1$. In this event, the second field effect transistor $QN_2$ is capable of receiving the current $I_2$ which is a saturation current. As a result, the second current input terminal is supplied with a current of $(I_1 - I_2)$. In this event, the current of $(I_1 - I_2)$ is caused to flow in the second current output terminal 29 and the resistor $R_0$. Consequently, $V_0$ is represented by a following formula (5).

$$V_0 = V_{cc} - (I_1 - I_2) \times R_0 \qquad (5)$$

When $I_1$ is not greater than $I_2$, the first current output terminal 17 is supplied with the current $I_1$. In this event, the second field effect transistor $QN_2$ is incapable of receiving the current $I_2$ which is the saturation current. As a result, a voltage $V_a$ of the second current input terminal 27 is represented by a following formula (6).

$$V_a < V_2 - V_t \qquad (6)$$

Inasmuch as $V_2$ is not greater than $2V_t$, Formula (6) is rewritten into a following formula (7).

$$V_a < V_t \qquad (7)$$

Consequently, the fifth and the sixth field effect transistors $QN_5$ and $QN_6$ can not become on. As a result, the resistor $R_0$ does not receive a current. In this event, the voltage output terminal 35 is supplied with the output voltage $V_0$ which is equal to the second power voltage $V_{cc}$.

Figure 3:
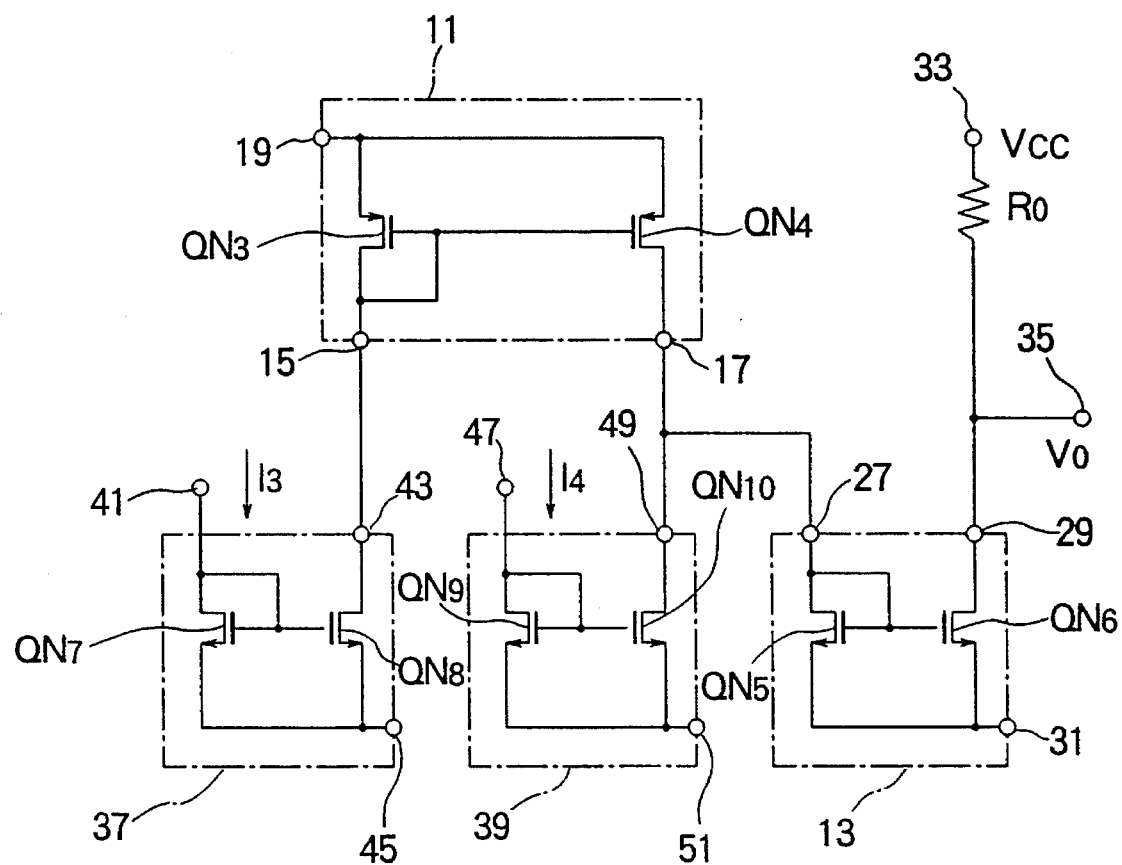
FIG. 3 is a circuit diagram of a comparator according to a second embodiment of this invention.

Referring to FIG. 3, the description will proceed to a comparator according to a second embodiment of this invention. Similar parts are designated by like reference numerals.

The comparator comprises the first current mirror circuit 11, the second current mirror circuit 13, a third current mirror circuit 37, and a fourth current mirror circuit 39.

The third current mirror circuit 37 has a third current input terminal 41, a third current output terminal 43, and a power terminal 45. The third current input terminal 41 is supplied with a third input current $I_3$. The third current output terminal 43 is connected to the first current input terminal 15. The power terminal 45 is supplied with a third constant power voltage from a power supply unit (not shown).

The third current mirror circuit 37 comprises seventh and eighth field effect transistors $QN_7$ and $QN_8$. The seventh field effect transistor $QN_7$ has a drain electrode connected to the third current input terminal 41, a gate electrode connected to the third current input terminal 41, and a source electrode connected to the power terminal 45. The eighth field effect transistor $QN_8$ has a drain electrode connected to the third current output terminal 43, a gate electrode connected to the third current input terminal 41, and a source electrode connected to the power terminal 45.

The fourth current mirror circuit 39 has a fourth current input terminal 47, a fourth current output terminal 49, and a power terminal 51. The fourth current input terminal 47 is supplied with a fourth input current $I_4$. The fourth current output terminal 49 is connected to the first current output terminal 17. The power terminal 51 is supplied with a fourth constant power voltage from a power supply unit (not shown).

The fourth current mirror circuit 39 comprises ninth and tenth field effect transistors $QN_9$ and $QN_{10}$. The ninth field effect transistor $QN_9$ has a drain electrode connected to the fourth current input terminal 47, a gate electrode connected to the fourth current input terminal 47, and a source electrode connected to the power terminal 51. The tenth field effect transistor $QN_{10}$ has a drain electrode connected to the fourth current output terminal 49, a gate electrode connected to the fourth current input terminal 47, and a source electrode connected to the power terminal 51. The fourth current output terminal 49 is connected to the first current output terminal 17 and to the second current input terminal 27.

When $I_3$ is greater than $I_4$, the first current output terminal 17 is supplied with a current of $I_3$. Also, the fourth current output terminal 49 is supplied with a current of $I_4$. As a result, the second current input terminal 27 is supplied with a current of $(I_3-I_4)$. Consequently, the second current mirror circuit 13 supply the current of $(I_3-I_4)$ to the second current output terminal 29. In this event, the current of $(I_3-I_4)$ is caused in the resistors $R_0$. $V_0$ is represented by a following formula (8).

$$V_0 = V_{cc} - (I_3 - I_4) \times R_0 \tag{8}$$

When $I_3$ is not greater than $I_4$, the first current mirror circuit 11 supplies the current of $I_3$ to the first current output terminal 17. However, the first current mirror circuit 11 does not supply the current of $I_4$ to the fourth current mirror circuit 39. In this event, the tenth field effect transistor QN10 is incapable of receiving the current of $I_4$ which is a saturation current.

It will be assumed that $K_3$ is represented by a following formula (9).

$$K_3 \geq 2 \times I_3 / V_t^2 \tag{9}$$

In Formula (9), $K_3$ represents an element constant of the ninth field effect transistor $QN_9$ and $V_t$ represents a threshold voltage in each of the ninth and the tenth field effect transistors $QN_9$ and QN10. In this event, $I_3$ is represented by a following formula (10).

$$I_3 = K_3 \times (V_g - V_t)^2 / 2 \tag{10}$$

In Formula (10), $V_g$ represents a voltage between the source and the gate electrodes of the tenth field effect transistor $QN_{10}$.

A following formula (11) is given by Formula (9).

$$I_3 \leq K_3 \times V_t^2 / 2 \tag{11}$$

A following formula (12) is given by substituting Formula (10) for $I_3$ in Formula (11).

$$\{K_3 \times (V_g - V_t)^2 / 2\} \leq \{K_3 \times V_t^2 / 2\} \tag{12}$$

A following formula (13) is given by Formula (12).

$$V_g - V_t \leq V_t \tag{13}$$

On the other hand, inasmuch as the tenth field effect transistor $QN_{10}$ is incapable of receiving the current of $I_4$ which is the saturation current, a voltage $V_d$ between the source electrode and an output terminal 51 of the tenth field effect transistor $QN_{10}$ is represented by a following formula (14).

$$V_d < V_g - V_t \tag{14}$$

A following formula (15) is given by substituting Formula (13) for $(V_g - V_t)$ in Formula (14).

$$V_d < V_t \tag{15}$$

Consequently, the fifth and the sixth field effect transistors $QN_5$ and $QN_6$ can not become on. As a result, the resistor $R_0$ does not receive a current. In this event, the voltage output terminal 35 is supplied with the output voltage $V_0$ which is equal to the second power voltage $V_{cc}$.

Figure 4:
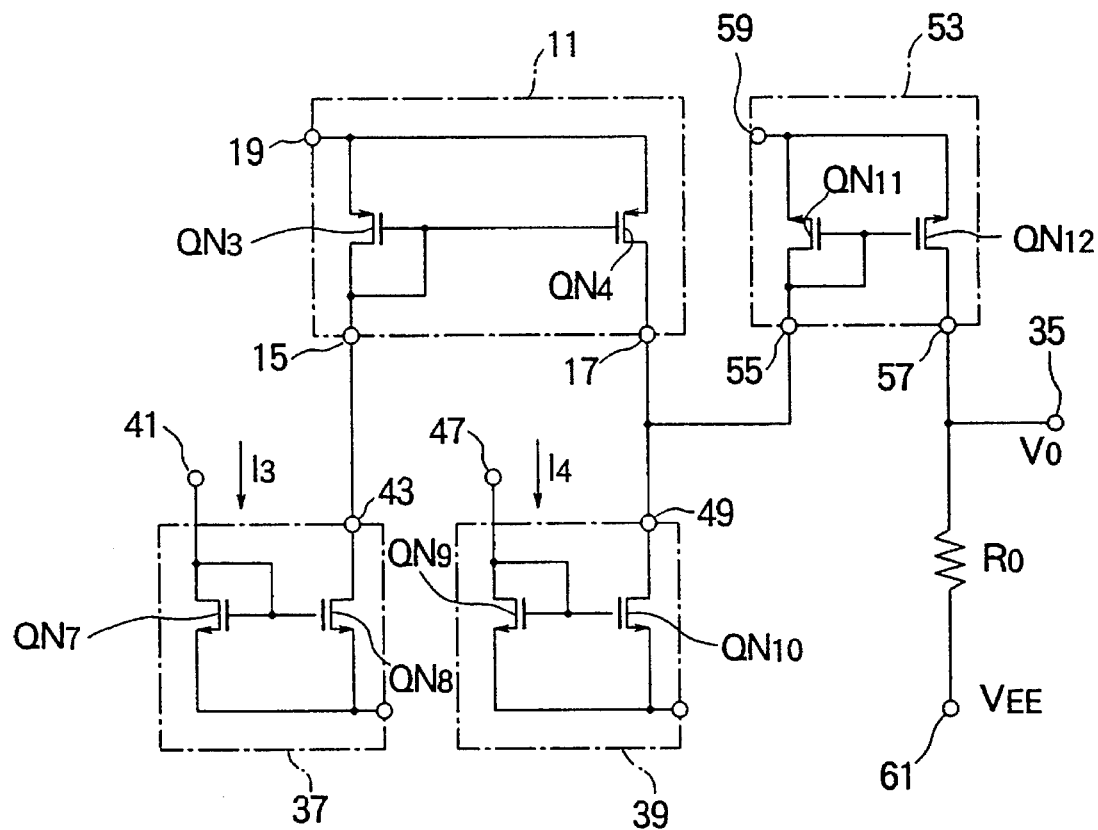
FIG. 4 is a circuit diagram of a comparator according to a third embodiment of this invention.

Referring to FIG. 4, the description will proceed to a comparator according to a third embodiment of this invention. Similar parts are designated by like reference numerals.

The comparator comprises the first current mirror circuit 11, the third current mirror circuit 37, the fourth current mirror circuit 39, and a fifth current mirror circuit 53.

The fifth current mirror circuit 53 has a fifth current input terminal 55, a fifth current output terminal 57, and a power terminal 59. The fifth current input terminal 55 is connected to a node between the first current output terminal 17 and the fourth current output terminal 49. The fifth current output terminal 57 is connected to a third power terminal 61 through the resistor $R_0$. The third power terminal 61 is supplied with a third power voltage $V_{EE}$ from a third power supply unit (not shown). The power terminal 59 is supplied with a fifth constant power voltage from a power supply unit (not shown).

The fifth current mirror circuit 53 comprises eleventh and twelfth field effect transistors $QN_{11}$ and $QN_{12}$. The eleventh field effect transistor $QN_{11}$ has a drain electrode connected to the fifth current input terminal 55, a gate electrode connected to the fifth current input terminal 55, and a source electrode connected to the power terminal 59. The twelfth field effect transistor $QN_{12}$ has a drain electrode connected to the fifth current output terminal 57, a gate electrode connected to the fifth current input terminal 55, and a source electrode connected to the power terminal 59.

When $I_3$ is greater than $I_4$, the current of $(I_3-I_4)$ is caused in the resistor $R_0$. Consequently, the output terminal 35 is supplied with the output voltage $V_0$ which is represented by a following formula (16).

$$V_0 = V_{EE} + (I_3 - I_4) \tag{16}$$

When $I_3$ is not greater than $I_4$, the eleventh and the twelfth field effect transistors $QN_{11}$ and $QN_{12}$ can not become on.

As a result, the resistor $R_0$ does not receive a current. In this event, the voltage output terminal 35 is supplied with the output voltage $V_0$ which is equal to the third power voltage $V_{EE}$.

Figure 5:
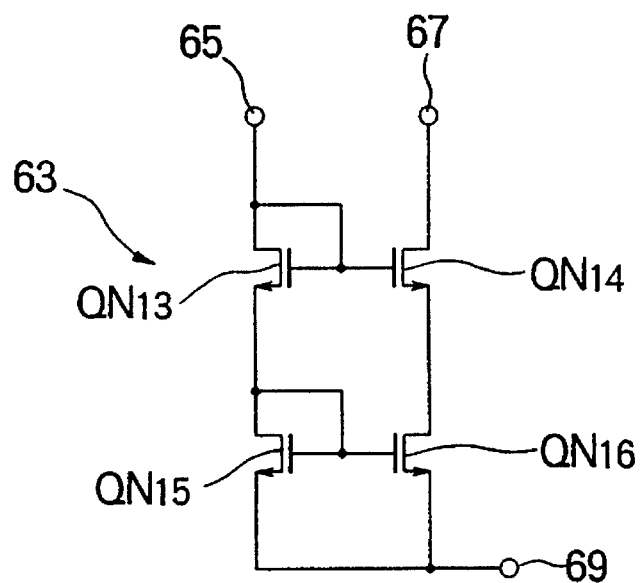
FIG. 5 is a circuit diagram of a part of a comparator according to a fourth embodiment of this invention.

Referring to FIG. 5, the description will proceed to a comparator according to a fourth embodiment of this invention.

The comparator comprises a sixth current mirror circuit 63 instead of the first, the second, the third, the fourth, or the fifth current mirror circuit 11, 13, 37, 39, or 53 illustrated in FIGS. 1 to 4.

The sixth current mirror circuit 63 has a sixth current input terminal 65, a sixth current output terminal 67, and a power terminal 69. The sixth current mirror circuit 63 comprises thirteenth through sixteenth field effect transistors $QN_{13}$ to $QN_{16}$.

The thirteenth field effect transistor $QN_{13}$ has a drain electrode connected to the sixth current input terminal 65, a gate electrode connected to the sixth current input terminal 65, and a source electrode. The fourteenth field effect transistor $QN_{14}$ has a drain electrode connected to the sixth current output terminal 67, a gate electrode connected to the sixth current input terminal 65, and a source electrode. The fifteenth field effect transistor $QN_{15}$ has a drain electrode connected to the source electrode of the thirteenth field effect transistor $QN_{13}$, a gate electrode connected to the source electrode of the thirteenth field effect transistor $QN_{13}$, and a source electrode connected to the power terminal 69. The sixteenth field effect transistor $QN_{16}$ has a drain electrode connected to the source electrode of the fourteenth field effect transistor $QN_{14}$, a gate electrode connected to the source electrode of the thirteenth field effect transistor $QN_{13}$, and a source electrode connected to the power terminal 69.

Figure 6:
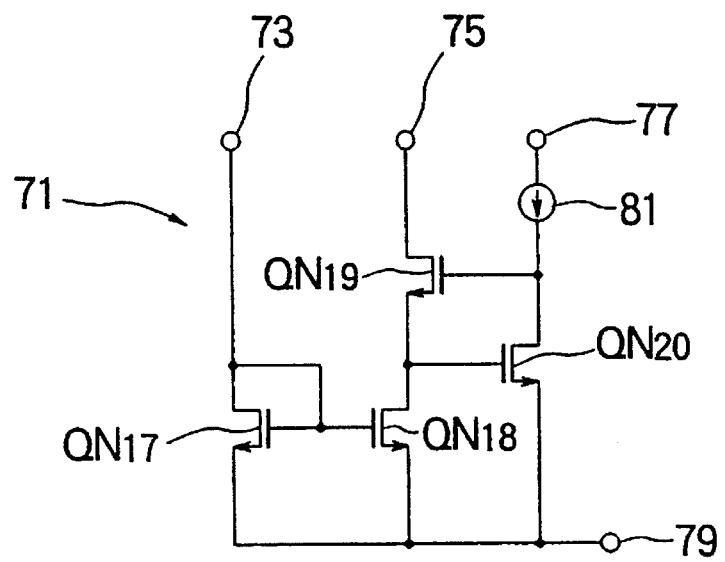
FIG. 6 is a circuit diagram of a part of a comparator according to a fifth embodiment of this invention.

Referring to FIG. 6, the description will proceed to a comparator according to a fifth embodiment of this invention.

The comparator comprises a seventh current mirror circuit 71 instead of the first, the second, the third, the fourth, or the fifth current mirror circuit 11, 13, 37, 39, or 53 illustrated in FIGS. 1 to 4.

The seventh current mirror circuit 71 has a seventh current input terminal 73, a seventh current output terminal 75, and power terminals 77 and 79. The seventh current mirror circuit 71 comprises seventeenth through twentieth field effect transistors $QN_{17}$ to $QN_{20}$ and a constant current source 81.

The seventeenth field effect transistor $QN_{17}$ has a drain electrode connected to the seventh current input terminal 73, a gate electrode connected to the seventh current input terminal 73, and a source electrode connected to the power terminal 79. The eighteenth field effect transistor $QN_{18}$ has a drain electrode connected to a source electrode of the nineteenth field effect transistor $QN_{19}$, a gate electrode connected to the seventh current input terminal 73, and a source electrode connected to the power terminal 79. The nineteenth field effect transistor $QN_{19}$ has a drain electrode connected to the seventh current output terminal 75, a gate electrode connected to the power terminal 77 through the constant current source 81, and the source electrode. The twentieth field effect transistor $QN_{20}$ has a drain electrode connected to a node between the constant current source 81 and the gate electrode of the nineteenth field effect transistor $QN_{19}$, a gate electrode connected to a node between the source electrode of the nineteenth field effect transistor $QN_{19}$ and the drain electrode of the eighteenth field effect transistor $QN_{18}$, and a source electrode connected to the power terminal 79.

While this invention has thus far been described in conjunction with five embodiments thereof, it will readily be possible for those skilled in the art to put this invention into practice in various other manners. For example, the ratio of $(W_0/L_0)$ to $(W_i/L_i)$ may be equal to $\alpha$.

What is claimed is:

1. A comparator having first and second voltage input terminals and a voltage output terminal, for comparing a first input voltage from said first voltage input terminal and a second input voltage from said second voltage input terminal to produce and supply an output voltage to said voltage output terminal, said comparator comprising:

a first current mirror circuit having a first current input terminal and a first current output terminal;

a first field-effect transistor having a first drain electrode connected to said first current input terminal, a first source electrode connected to a first power terminal, and a first gate electrode connected to said first voltage input terminal, said first power terminal supplied with a low voltage having a low level;

a second field-effect transistor having a second drain electrode connected to said first current output terminal, a second source electrode connected to said first power terminal, and a second gate electrode connected to said second voltage input terminal; and a second current mirror circuit having a second current input terminal connected to said first current output terminal and a second current output terminal connected to a second power terminal through a resistor and to said voltage output terminal, said second power terminal supplied with a high voltage having a high level which is higher than said low level.

2. A comparator having first and second current input terminals and a voltage output terminal, for comparing a first input current from said first current input terminal and a second input current from said second current input terminal to produce and supply an output voltage to said voltage output terminal, said comparator comprising:

a first current mirror circuit having a first current output terminal and said first current input terminal;

a second current mirror circuit having a second current output terminal and said second current input terminal;

a third current mirror circuit having a third current input terminal connected to said first current output terminal and a third current output terminal connected to said second current output terminal; and a fourth current mirror circuit having a fourth current input terminal connected to said third current output terminal and to said second current output terminal and a fourth current output terminal connected to a power terminal through a resistor and to said voltage output terminal, said power terminal supplied with a power voltage.

3. A comparator according to claim 1, wherein said first current mirror circuit further includes a power terminal and a third field-effect transistor, said third field-effect transistor including a drain electrode coupled to said first current input terminal, a gate electrode coupled to said first current input terminal and a source electrode coupled to said power terminal of said first current mirror circuit.

4. A comparator according to claim 3, wherein said first current mirror circuit further includes a fourth field-effect transistor, said fourth field-effect transistor including a drain electrode coupled to said first current output terminal, a gate electrode coupled to said first current input terminal and a source electrode coupled to said power terminal of said first current mirror circuit.

5. A comparator according to claim 1, wherein said second current mirror circuit further includes a power terminal and a fifth field-effect transistor, said fifth field-effect transistor including a drain electrode coupled to said second current input terminal, a gate electrode coupled to said second current input terminal and a source electrode coupled to said power terminal of said second current mirror circuit.

6. A comparator according to claim 5, wherein said second current mirror circuit further includes a sixth field-effect transistor, said sixth field-effect transistor including a drain electrode coupled to said second current output terminal, a gate electrode coupled to said second current input terminal and a source electrode coupled to said power terminal of said second current mirror circuit.

7. A comparator according to claim 1, wherein said second current input terminal is coupled to a node between the first current output terminal and said second drain electrode of said second field-effect transistor.

8. A comparator according to claim 6, wherein said voltage output terminal is coupled to a node between said resistor and said drain electrode of said sixth field-effect transistor.

9. A comparator according to claim 2, wherein said first current mirror circuit further includes first and second field-effect transistors.

10. A comparator according to claim 9, wherein said second current mirror circuit further includes third and fourth field-effect transistors.

11. A comparator according to claim 2, wherein said third current mirror circuit further includes a power terminal and a fifth field-effect transistor, said fifth field-effect transistor including a drain electrode coupled to said third current input terminal, a gate electrode coupled to said third current input terminal and a source electrode coupled to said power terminal of said third current mirror circuit.

12. A comparator according to claim 11, wherein said third current mirror circuit further includes a sixth field-effect transistor, said sixth field-effect transistor including a drain electrode coupled to said third current output terminal, a gate electrode coupled to said third current input terminal and a source electrode coupled to said power terminal of said third current mirror circuit.

13. A comparator according to claim 2, wherein said fourth current mirror circuit further includes a power terminal and a seventh field-effect transistor, said seventh field-effect transistor including a drain electrode coupled to said fourth current input terminal, a gate electrode coupled to said fourth current input terminal and a source electrode coupled to said power terminal of said fourth current mirror circuit.

14. A comparator according to claim 13, wherein said fourth current mirror circuit further includes an eighth field-effect transistor, said eighth field-effect transistor including a drain electrode coupled to said fourth current output terminal, a gate electrode coupled to said fourth current input terminal and a source electrode coupled to said power terminal of said fourth current mirror circuit.

15. A comparator according to claim 2, wherein said voltage output terminal is coupled to a node between said resistor and a drain electrode of said second current mirror circuit.

16. A comparator according to claim 2, wherein input currents are caused to flow into said third and fourth current mirror circuits.

17. A comparator according to claim 2, wherein input currents are caused to flow in an inflow direction of said third and fourth current mirror circuits.

18. A comparator according to claim 2, wherein third and fourth input currents of said third and fourth current mirror circuits are caused to flow in a same direction.

* * * * *